United States Patent [19]

Stephenne et al.

[11] 4,035,724
[45] July 12, 1977

[54] DIGITAL CONVERTER FROM CONTINUOUS VARIABLE SLOPE DELTA MODULATION TO PULSE CODE MODULATION

[75] Inventors: Hubert Stephenne, Rock Forest; Michel Villeret; Pierre A. Deschenes, both of Sherbrooke, all of Canada

[73] Assignee: Universite de Sherbrooke, Sherbrooke, Canada

[21] Appl. No.: 468,091

[22] Filed: May 8, 1974

[51] Int. Cl.$^2$ ..................................... H03K 13/24
[52] U.S. Cl. ..................... 325/38 B; 179/15 AP; 340/347 DD
[58] Field of Search ........... 325/38 B; 340/347 DD; 179/15 A, 15 AV; 235/154

[56] References Cited

U.S. PATENT DOCUMENTS

| | | | |
|---|---|---|---|
| 3,526,855 | 9/1970 | McDonald | 325/38 R |
| 3,638,219 | 1/1972 | Harms | 325/38 R |
| 3,683,288 | 8/1972 | Curry | 307/232 |
| 3,694,639 | 9/1972 | Deschenes et al. | 235/154 |
| 3,703,688 | 11/1972 | Flanagan | 325/38 B X |
| 3,706,944 | 12/1972 | Tewksbury | 325/38 B |
| 3,707,712 | 12/1972 | Deschenes et al. | 340/347 DD |
| 3,746,990 | 7/1973 | LeDiberder et al. | 325/38 B |
| 3,750,144 | 7/1973 | Bolus et al. | 340/347 DD |
| 3,766,542 | 10/1973 | Tomazawa | 340/347 DD |
| 3,825,831 | 7/1974 | Ishiguro | 325/38 B |
| B 295,674 | 1/1975 | McDonald | 340/347 DD |

OTHER PUBLICATIONS

Cummiskey et al, "Adaptive Quantizing in Differential PCM –," 9/1973, BSTJ vol. 52, No. 7, pp. 1105-1118.
Schindler, "Linear, Nonlinear, and Adaptive Delta Modulation," 11/1974, IEEE Trans. on Commun. vol. COM-22, pp. 1807-1823.

Primary Examiner—Thomas J. Sloyan
Attorney, Agent, or Firm—Robic, Robic & Associates

[57] ABSTRACT

The invention relates to a digital converter and to a method for digitally converting a coded signal being at a delta rate into another coded signal flowing at a PCM rate. First, the code of the delta signal is converted into an intermediate code, this intermediate code being at a rate corresponding to the delta rate. Then, the rate of the intermediate coded signal is converted into the rate of the PCM signal. And, finally, the code of the intermediate signal is changed into the code of the PCM signal.

10 Claims, 12 Drawing Figures

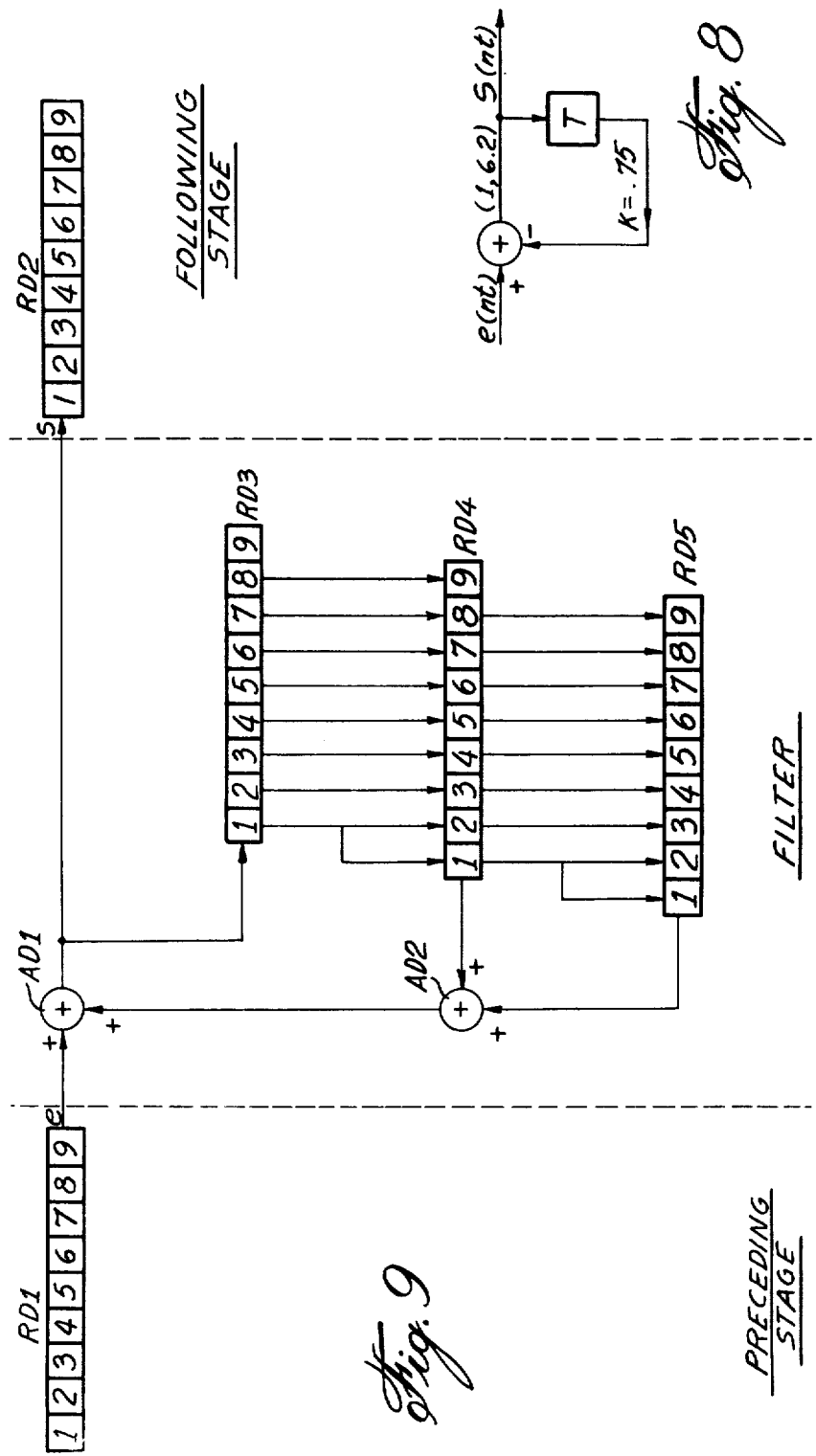

DIGITAL CONVERTER FROM CONTINUOUS VARIABLE SLOPE DELTA MODULATION TO PULSE CODE MODULATION

The present invention relates to a method and a system for digitally converting a coded signal flowing at a predetermined rate into another coded signal flowing at another predetermined rate, the two coded signals respectively belonging to two different signal transmission systems. In particular, the converting system of the invention realizes the adaptation of a delta modulation (Δm) system to a pulse code modulation (PCM) system.

Most particularly, the present method and system permit the linkage of delta modulation systems within a telecommunication network provided with PCM systems. The converter of the invention is entirely digital and allows the conversion of delta signals into PCM signals, which are widely used in telephony. The converter of the invention will be hereinafter designated as a DDMC.

Delta modulation and PCM are two different manners of digitally representing an analog signal. Both transmit only samples of the input signal and thus information on the signal is available only at sampling time. Those two systems present basic differences: they do not use the same digital code to transmit the information on the samples and they operate at different sampling rates. Therefore, a PCM decoder receiving a binary delta sequence is unable to reconstruct the analog signal for two reasons: as sampling rates are different, the PCM decoder is not looking for the information at the right time, and as the codes are different, the decoder cannot "understand" the meaning of the binary words it is receiving.

A prime object of the present invention is to provide a method and a system capable of interfacing between two systems, the respective signals of which are differently coded and sampled. This is achieved through the use of a DDMC which realizes a code conversion and a sampling rate conversion.

According to the invention, the method for converting the code and the sampling rate of a first signal into the code and the sampling rate of a second signal is carried out by means of a first code conversion unit which receives the first signal and converts its code into an intermediate code, the rate of the intermediate code being the rate of the first signal; a rate conversion unit connected to the first code conversion unit for converting the rate of the intermediate signal into the rate of the second signal; and a second code conversion unit which receives the intermediate signal and converts its code into the second signal code.

Thus, the first code conversion unit, when receiving a delta signal, will convert the code of the delta signal into an intermediate code which will be a linear PCM signal, whereas the rate conversion unit will effect the conversion of the delta sampling rate into the PCM sampling rate. The intermediate code at PCM sampling rate will then be converted into the PCM code through the second code conversion unit.

Above and other objects will become apparent through the following description of preferred embodiments of the invention, which is given with reference to the accompanying drawings, wherein FIG. 1A is a block diagram showing a non-adaptive delta modulator, such modulator is known in the art;

Figure 2:
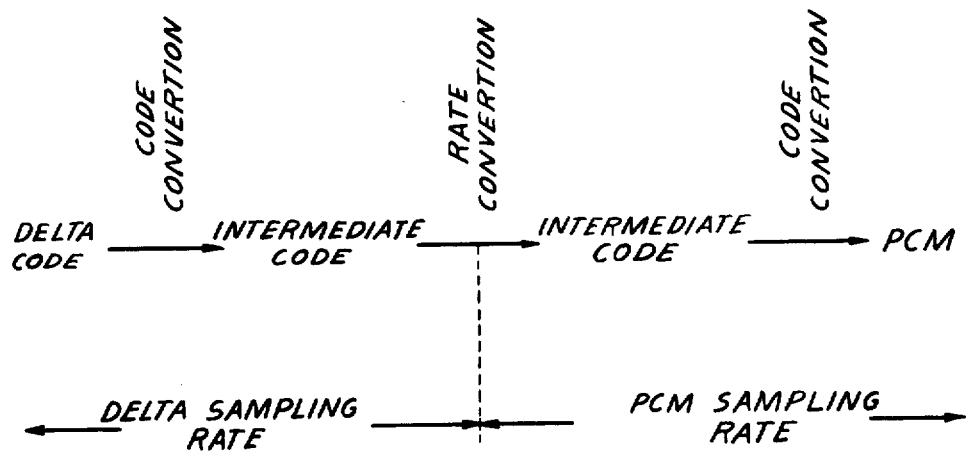
FIG. 2 depicts a method for converting a delta signal from a delta modulation system into PCM signal, in accordance with the present invention.
Figure 3:
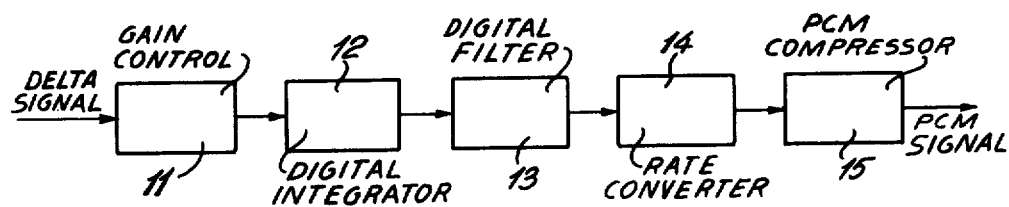
Figure 4:
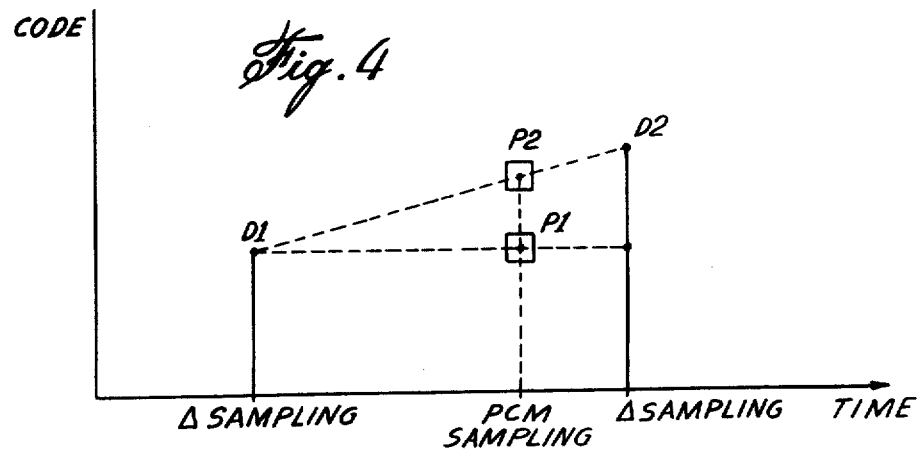
Figure 5:
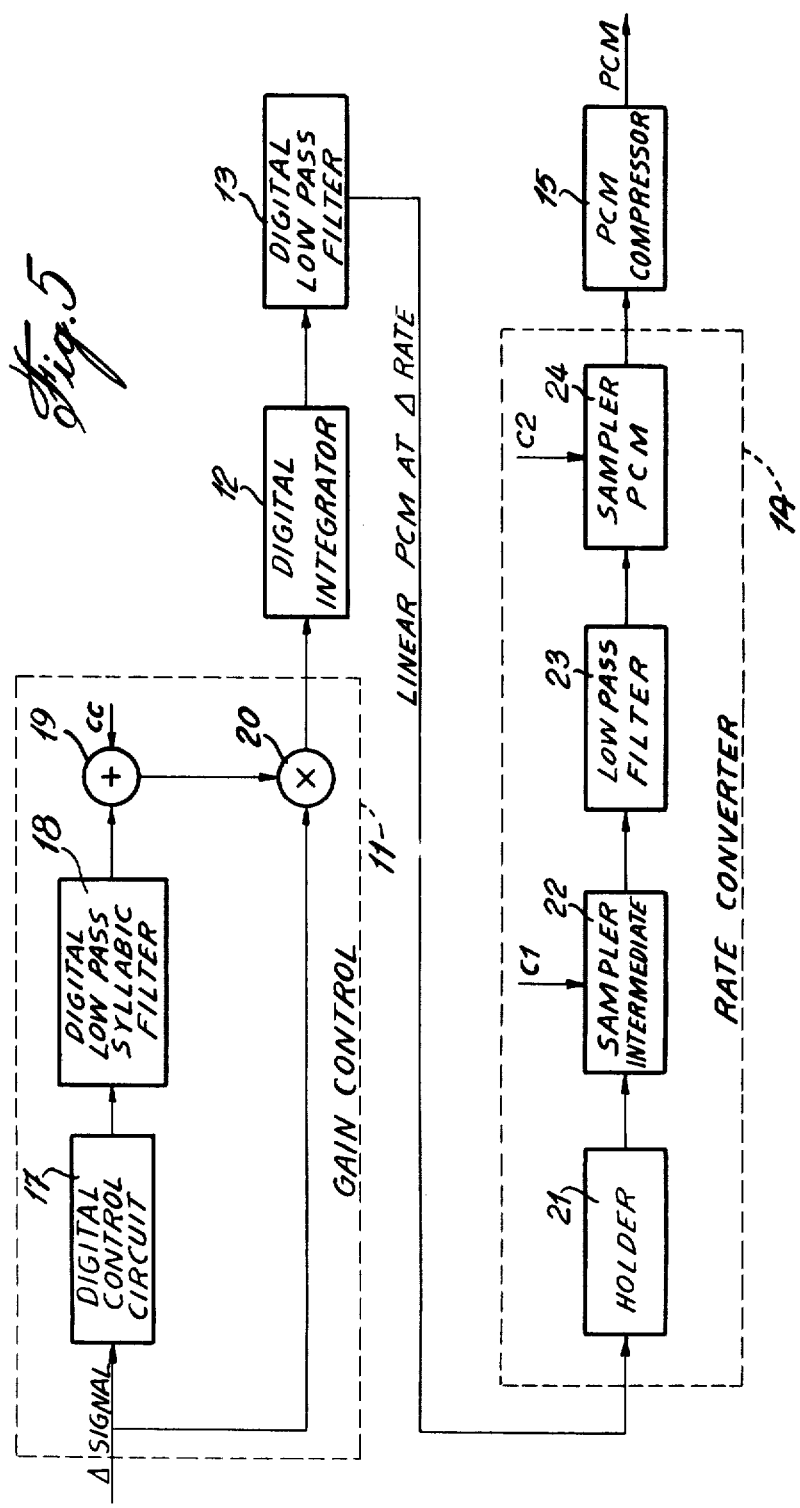
Figure 6:
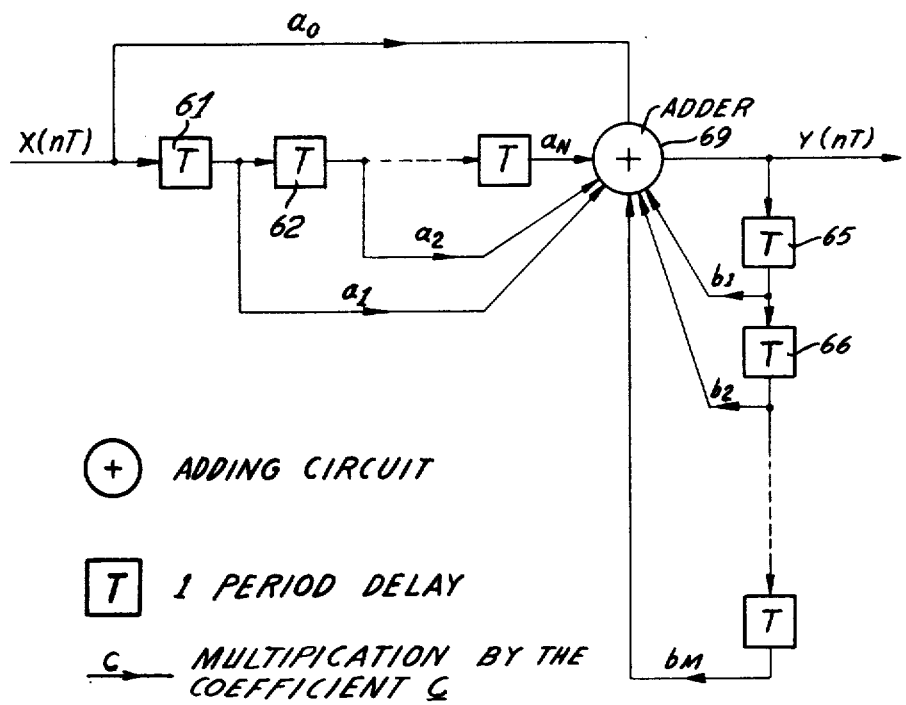
Figure 7:
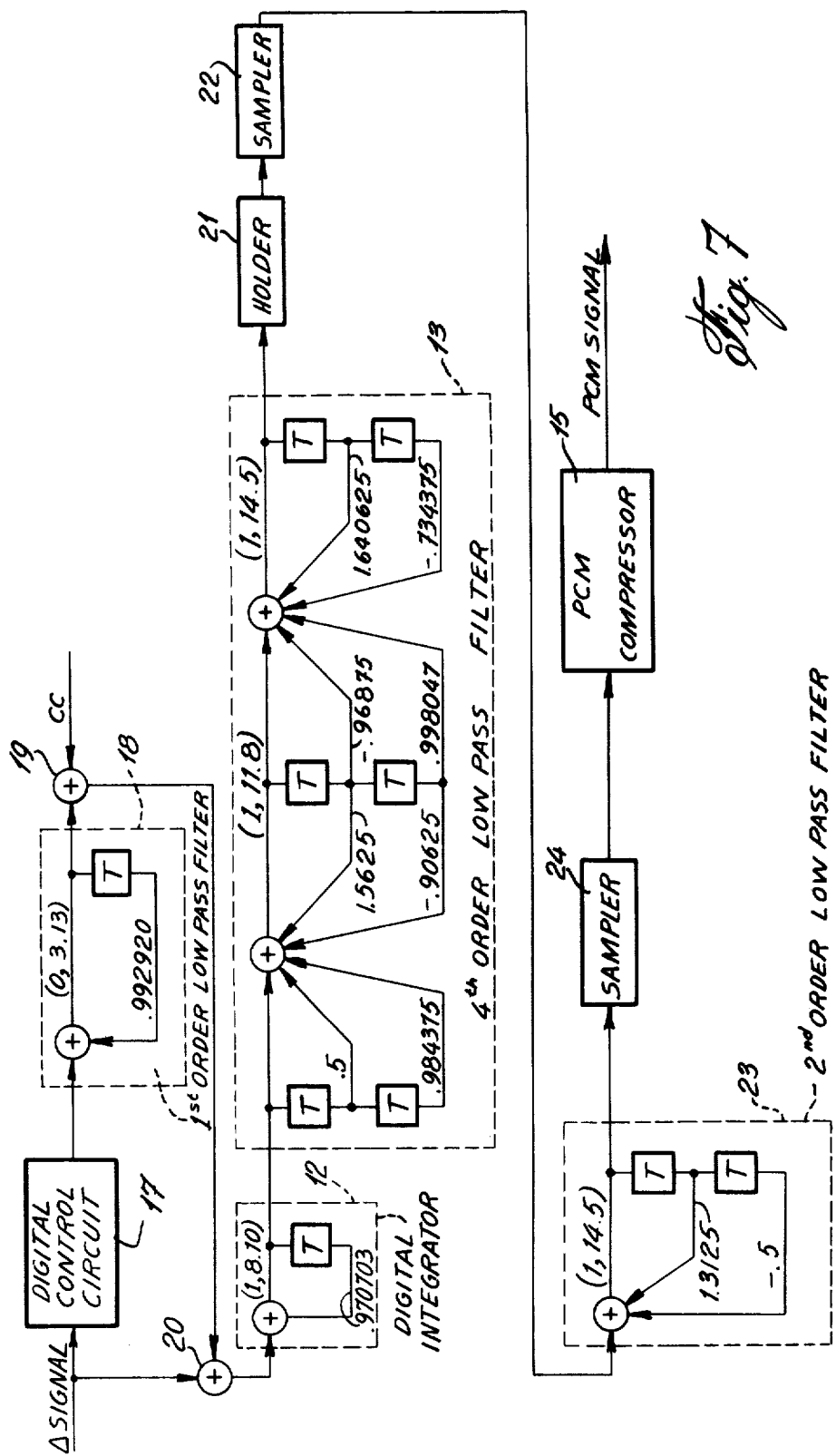
Figure 10:
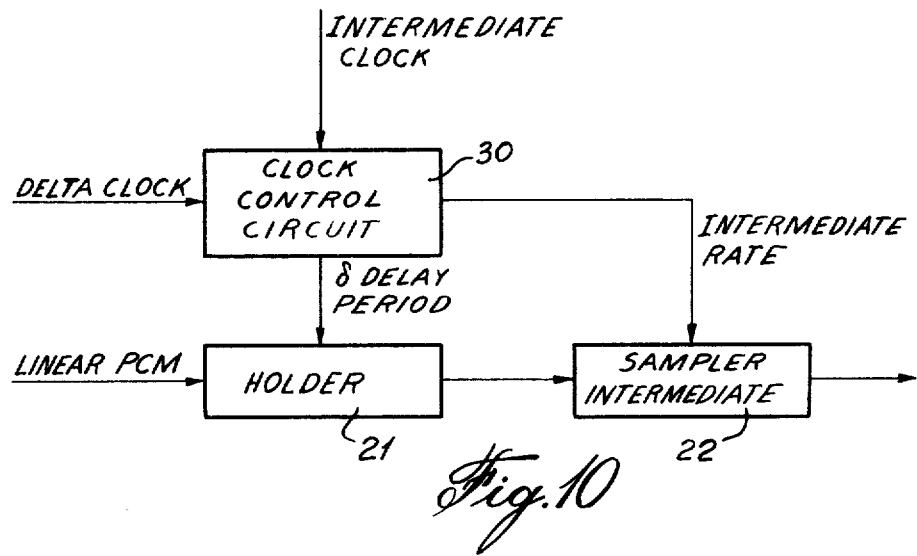
Figure 11:
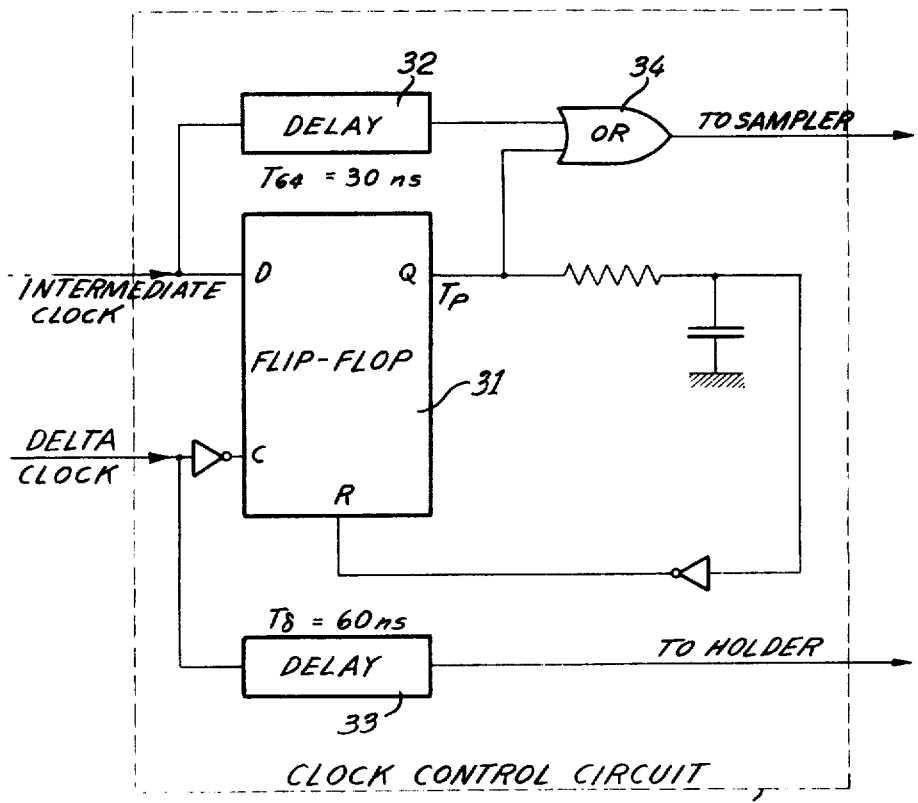

FIG. 3 shown the system of the invention capable of carrying out the delta to PCM conversion method illustrated in FIG. 2;

FIG. 4 shows a method of interpolation between two PCM samples;

FIG. 5 is a detailed block diagram of the CVSD to PCM converter shown in FIG. 3;

FIG. 6 generally illustrates a digital filter of the type used in the system of FIG. 5;

FIG. 7 shows the implementation diagram of the DDMC of the invention;

FIG. 8 represents symbolically a digital first order filter;

FIG. 9 shows a realization of the digital filter of FIG. 8;

FIGS. 10 and 11 show a clock control circuit also of the invention.

Figure 1A:
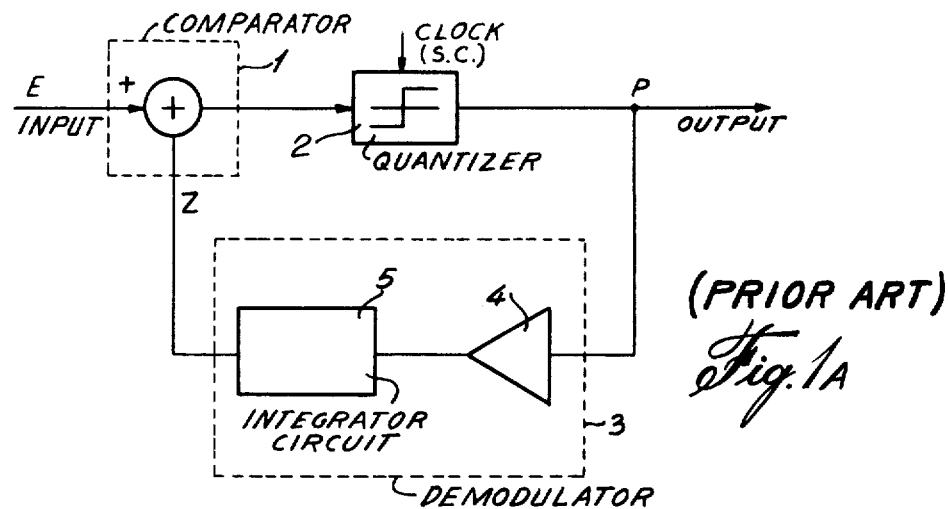
FIG. 1B shows a known delta modulator similar to the one illustrated in FIG. 1A, but capable of following the amplitude variation of the input signal, such a modulator is called a continuous variable slope delta modulator (CVSD)

Referring to FIG. 1A, there is shown a known delta modulation system, usually referred to as a delta coder, which is, generally a A/D converter. It is a closed loop or a feedback system whereby the slope variations of an analog input signal taken between two sampling periods are transmitted into a digitized signal. This digitized signal is reconstructed in a feedback loop which acts as a demodulator; this demodulator is the important part of the system and its design differentiates one coder from others.

As shown in FIG. 1A, an input analog signal E is compared to a reconstructed signal Z in a comparator 1. The difference or error signal (E − Z) is then fed through a two-level quantizer 2, which is controlled by a sampling clock (S.C.). At each clock period, the quantizer 2 gives information on the sign of the error signal. Thus, the quantizer output is a $v$ (logic 1) if the error is positive and a $-v$ (logic 0) if the error is negative, $v$ being any voltage level determined by the quantizer. The sequence P of $v$ and $-v$ is then integrated in the feedback loop through the demodulator 3 which includes an amplifier 4 serially connected to an integration network 5. Because the gain of the amplifier 4 is a static gain, the delta coder is said to be non-adaptive. The output signal Z of the demodulator 3 is a staircase signal which is generally referred to as the reconstructed signal.

Figure 1B:
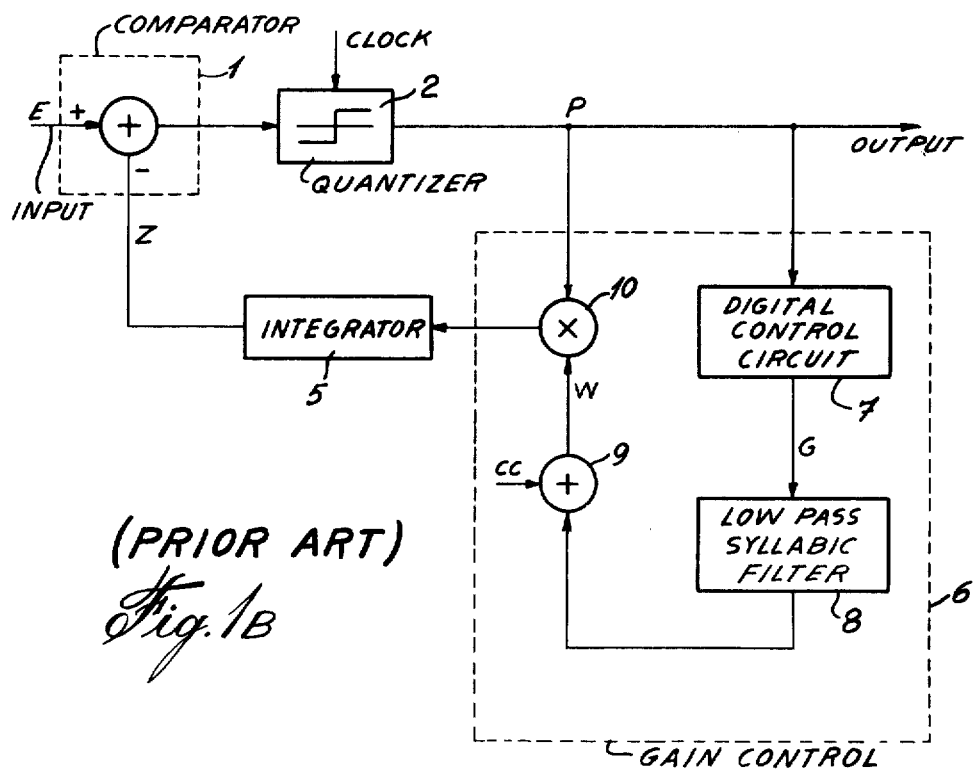

FIG. 1B shows a delta coder of the adaptive type since the gain of the demodulator in the feedback loop is made variable in order to follow the amplitude or slope variation of the input signal. Such a system is known in the art as a continuous-variable-slope-delta (CVSD) modulation system.

In the CVSD, adaptation or companding is achieved through the past behaviour of the signal averaged over a rather long period of time, compared to the sampling period; the control is done with the digital description of the waveform (bit stream).

An incoming analog signal E is compared with a reconstructed analog signal Z by means of a comparator 1 which outputs either a logic 1 or a logic 0, depending on which of the signals E or Z is the larger. The result of this comparison is then clocked through the quantizer 2 and transmitted as the encoded digital output P.

The reconstructed analog signal Z is produced by integrating the digital output P which has been multiplied by a weighting factor W provided by a gain control 6 incorporated thereon in order to produce a more accurate profile of the analog signal E. This weighting factor is initiated by detecting at least three-like and consecutive bits in the binary sequence P, by means of a digital control circuit 7. Upon this detection, a signal G is produced and furtheron filtered through a syllabic low pass filter 8 (usually at 25 Hz). The output of the syllabic filter 8 is a continuous signal which is added through adder 9 to a DC voltage to increase the amplitude of the filter output and to improve its signal-on-noise ratio, and thereafter mixed through multiplier 10 to the output digital signal P to obtain a delta step which is then integrated by means of integrator 5.

An important point with respect to gain control 6 is that the digital control circuit 7 is controlled by a three-bit memory (A, B and C), whereby the following control logic is performed:

$$G = ABC + \overline{A}\overline{B}\overline{C}$$

Let us introduce, for sake of completeness, the pulse code modulation (PCM) system which is indeed widely used in telephony. A PCM system, in general, embodies several basic processes such as sampling, quantizing, pulse shaping (coding) and decoding. According to the sampling theorem, a band limited function can be reconstructed from samples provided at a rate exceeding twice the highest modulating frequency. The amplitude of those samples are represented by certain discrete predetermined levels, and this is called quantizing. Any one quantized signal sample is coded into a group of $n$ pulses that are sent on the transmission line.

On the other hand, companding techniques are widely used in PCM systems designed for speech signal transmission. The companding techniques allow a reduction of the bit rate usually necessary for transmitting a signal, and that without decreasing the entropy and the objective quality (signal-to-noise ratio). The three well known PCM companding laws used for speech transmission are the $\mu = 100$, 7 bits;

$\mu = 255$, 7 or 8 bits; and $A$-law, 7 or 8 bits.

The PCM system usually uses a sampling frequency for the audio signal of 8 kHz.

As seen from above, delta modulation and PCM are two different manners of digitally representing an analog signal. Both transmit only samples of the analog input signal and thus the information on this signal is available only at specific sampling time. Those two modulation methods, however, differ in many respects: they do not use the same digital code to transmit the information on the samples, and furthermore their sampling rate is different.

Therefore, a PCM decoder receiving a binary delta sequence is unable to reconstruct the analog signal since, as the sampling rate is different, the PCM decoder is not looking for the information at the right time, and, as the codes are different, it cannot "understand" the meaning of the binary words it is receiving.

Consequently, to interface between delta and PCM systems, a digital converter for converting a delta signal to a PCM signal is required. Such a converter will be hereafter designated as a DDMC.

Thus, to render a delta system compatible with a PCM system, the DDMC has to realize a code conversion and a sampling rate conversion. As shown in FIG. 2, this is done by using an intermediate binary code which permits an effective code conversion from delta to PCM. The sampling rate conversion is made at that coding level.

The selected intermediate code is a linear binary representation of the signal amplitude (linear PCM). It permits rate conversion by means of interpolation methods.

The general principle of the DDMC in accordance with the present invention is shown in FIG. 2. The first step consists in effecting a code conversion at delta sampling rate of a delta code word into a linear PCM code word to obtain an intermediate code which is produced at the delta sampling rate (usually at a frequency of 38.4, 32.0 or 19.2 kHz.). But, a code word at the PCM sampling rate is required. Since the output PCM usually uses an 8 kHz sampling rate, a rate conversion from the delta sampling frequency down to the PCM sampling frequency is effected. Thereafter, the intermediate code words are available at PCM sampling rate. The last conversion is effected to transform the intermediate code word (linear PCM) into the output PCM word (compressed PCM).

Referring to FIG. 3, there is shown a block diagram of the delta to PCM DDMC according to the invention which realize the converting system generally described in FIG. 2. The DDMC system illustrated is completely digital. It is working with sample signals expressed in binary form. Thus, once per sampling period each block shown in FIG. 3 receives a binary number, having an input value, and uses it to provide an output value which is also a binary number.

Keeping in mind the general principle of the invention (FIG. 2), the code conversion, from delta to linear PCM at delta sampling rate, to produce the intermediate code is made by means of a gain control circuit 11 and a digital integrator 12. That intermediate code represents the amplitude of the transmitted signal. To reconstruct this amplitude at delta sampling time, the incoming delta sequence is first fed into the gain control circuit 11 which determines the delta step size. The gain control circuit 11 is a logic circuit which by using the delta sequence, generates once per delta period a binary word which represents the value of the delta step at this instant. The digital integrator 12 is also a logic circuit which determines the amplitude of the transmitted signal by integrating the values of the delta steps. The output of the integrator is a binary word: the intermediate code word at delta sampling rate. The output of the integrator 12 is fed to a low-pass digital filter 13 which issues a linear PCM signal at delta rate.

The digital filter 13 is a logic circuit which transforms the digital version of the signal (represented by the binary intermediate code) in the same way as a continuous filter would transform the analog version of the same signal (represented by an analog voltage). It is a low-pass filter (cut-off frequency around 3.5 kHz) whose purpose is to attenuate high frequency components of the delta quantizing noise. The output of the filter is again a sequence of binary words which represents the transmitted signal smoothed by the low-pass characteristic.

The rate reduction from delta frequency down to PCM frequency (around 8 kHz) is made by a rate converter 14. At the input of the converter, the amplitude of the voice signal (intermediate code word) is known at each delta sampling instant. The converter 14 is a logic circuit which generates an intermediate code word at each PCM sampling time. The circuit complexity depends on the delta sampling rate. At 32 kHz for example, the sampler 34 only needs to disregard three samples out of four and keep the fourth one. At 19.2 kHz and 38.4 kHz for example, the circuit is more complex because the delta rate is no more an integer multiple of the PCM rate and the sampling instants are not coincident. In this case the PCM sampling time is generally between two delta sampling times and as the value of the intermediate code is known only at delta sampling time, the value at PCM sampling time must be estimated by an interpolation method.

The interpolation means depends on the system signalover-noise ratio (i.e., depends on the type of delta modulation and on the sampling frequency). When possible without degrading the system performance, a "zero-order digital holder" is used. In this case the latest available value is stored (held) and used when needed. When a higher quality is necessary, a "linear interpolation" is used.

Such interpolation adds noise to the system and in some cases a low-pass digital filter (cut-off frequency around 3.5 kHz) must be placed after the interpolator to remove excessive out-of-voice-band noise.

FIG. 4 shows a diagram of such interpolation methods wherein D1 and D2 are two successive code words at delta sampling time. P1 and P2 are two different estimates of the code value at PCM sampling time. P1 is obtained by zero-order holding and P2 by linear interpolation, as discussed above.

The intermediate code word which appears at the output of the converter at PCM sampling rate is a binary linear representation of the transmitted signal. This linear word is then compressed through compressor 15 into the 7 or 8 bits PCM code according to the remote PCM channel bank characteristic.

FIG. 5 more elaborately illustrates the DDMC of the invention shown in FIG. 3. The delta sequence is fed to the gain control circuit 16 which generates, once per sampling period, a binary number representing the delta step size. The gain control circuit 16 includes a digital control circuit 17 connected to a digital low-pass syllabic filter 18 the output of which is multiplied by means of multiplier 20 by the incoming delta sequence after having been added at 19 to a DC voltage for improving the signal-to-noise ratio and the amplitude of the signal from the filter 18. It is to be noted that the control circuit 17 is similar to the control circuit 7 used in the CVSD coder described in FIG. 1B. The digital syllabic filter 18 is used to smoothen the digital output of the control circuit 17.

The digital integrator 12 is a digital first-order low-pass filter having a low cut-off frequency. This integrator digitally integrates all the binary numbers received from the digital control circuit and produces, once per delta sampling period, a binary number which represents the sum of all the delta steps. This binary number is the intermediate code word (FIG. 2).

The intermediate code word is then processed by a digital low-pass filter 13 in order to attenuate the high frequency components of the quantizing noise before effecting the rate conversion. Once per delta sampling period the filter 13 produces a linear PCM signal free of the delta noise, this linear PCM signal being at a delta rate.

The rate conversion from delta to PCM sampling frequency is achieved by means of the rate converter 14. This converter 14 includes a zero-order holder 21 followed by a sampler 22, sampling the holder output at a rate determined by clock C1. A low-pass digital filter 23 of the second-order type is connected to the sampler 22, and then the sampling rate of 22 is reduced to a PCM sampling rate, through sampler 24. If, for instance, the sampler 22 works at 64 kHz, the sampling rate will be reduced from 64 to 8 kHz by means of clock C2 of sampler 24 by taking one sample out of 8. The holder and samplers used in the present arrangement are readily available in the market, for example from Datel Systems Inc., Canton, Mass., U.S.A.

The output of the sampler 24 is a linear PCM word (intermediate code) at PCM sampling rate. This linear PCM is then digitally compressed to produce a PCM word through the compressor 15. Such digital compressor is, for instance, described in U.S. Pat. No. 3,694,639 issued in September 1972 to Deschenes et al., or in U.S. Pat. No. 3,863,248 issued on Jan. 28, 1975 to Villeret et al.

As digital filters are widely used in the present invention, we will briefly indicate the general structure of those filters with reference to FIG. 6.

Digital filtering is the process of spectrum shaping using digital hardware. The aims of digital filtering are the same as those of continuous filtering, but the processed signals are discrete instead of being continuous.

In a digital filter, the input and output signals are not represented by a continuous waveform but by samples. Usually, the sample values are given by binary members. Once per sampling period, the filter receives a signal sample and produces by means of digital logic operation and output sample.

The output sample ($Y(nT)$) of a digital filter at time $nT$ (sampling period $T$ seconds) is computed from the input sample ($x(nT)$) and a linear combination of past inputs and outputs.

$$Y(nT) = \sum_{i=0}^{N} a_i \times ((n-i)T) + \sum_{i=1}^{M} b_i Y((n-i)T)$$

where $a_i$ and $b_i$ are constant coefficients. The above equation is called a finite difference equation.

The logic circuit which implements the operations of the above equation is schematically represented in FIG. 6.

The input sample $x(nT)$ is fed into a one period delay block and $x((n-1)T)$ is available at the output of this block. There are $N$ such delay blocks 61, 62 . . . connected in tandem which provide the values of $x((n-1)T)$, $x((n-2)T)$, $x((n-N)T)$. Each of these $x((n-i)T)$ ($i = O$ to $N$) is multiplied by its weighting factor $a_i$. Similarly, $M$ delay blocks 65, 66 provide the values of $y((N-i)t)$ ($i = 1$ to $M$) which are multiplied by the coefficients $b_i$. An adder 69 gives the output value $y(nT)$ by computing the sum of all these terms.

Once the theoretical values of the factors $a_i$ and $b_i$ have been computed, they had to be rounded in order to make the practical implementation as simple as possible.

To minimize the hardware complexity and/or the operating times of the converter, the theoretical values of the filter coefficients have been changed to approximate values. Of course, the coefficient rounding modifies the filter frequency response and the amount of simplification are limited by the desired filter performance. It is to be noted that the filter characteristic is more sensitive to coefficient rounding when the sampling frequency is high. For this reason, coefficients are generally simpler at 19.2 kHz than at 32 or 38.4 kHz, for example.

Referring back to FIG. 5, the filters 12, 13, 18 and 23 are digital filters of a type as generally described above. More particularly, the Z transfer function of each of those filters are as follows:

a. the digital integrator or filter 12 is preferably a first-order filter, thus the transfer function is $$H(z) = \frac{1}{1 - bz^{-1}}$$

b. the digital filter 13 is preferably a fourth-order low-pass filter having the following transfer function $$H(z) = \frac{(1 - cz^{-1} + dz^{-2})(1 + z^{-1}/f)^{-1}}{(1 - gz^{-1} + hz^{-2})(1 + z^{-1}/j)^{-1}}$$

c. the low-pass filter 18 is preferably of the first-order type with a transfer function $$H(z) = \frac{1}{1 - az^{-1}}$$

d. the low-pass filter 23 is preferably of the second-order and has a transfer function $$H(z) = \frac{1}{1 - kz^{-1} + mz^{-2}}$$

As mentioned previously, the respective value of the coefficients $a$ to $m$ appearing in the transfer functions varies with the delta sampling frequencies and may be calculated following any appropriate methods, one being given in an article entitled "Digital Filter Design Techniques in the Frequency Domain," by Rader et al. and published in Proc. IEEE, Vol. 55, Feb. 1967. For example, the following coefficient values have been determined for various delta sampling rates, as shown in the following table.

| Δ sampling rates | | 16 kHz | 19.2 kHz | 32 kHz | 38.4 kHz |
|---|---|---|---|---|---|
| | a | 0.984375 | 0.988281 | 0.992920 | .994141 |
| | b | 0.9375 | 0.949219 | .970703 | 0.97265 |
| | c | 1.75 | 1.5 | .5 | 0.09375 |
| | d | 0.992188 | 0.984375 | .984375 | 0.984375 |
| Filter | e | .9375 | 0.3125 | −.96875 | −1.25 |
| coefficient | f | .99609 | 0.996094 | 0.998047 | .998047 |
| values | g | 1.125 | 1.3125 | 1.5625 | 1.6875 |
| | h | .46875 | 0.5625 | .90625 | 0.925782 |
| | i | .625 | 0.96875 | 1.640625 | 1.71875 |
| | j | .8125 | 0.84375 | .734375 | 0.78125 |
| | k | 1.3125 | 1.3125 | 1.3125 | 1.3125 |
| | m | 0.5 | 0.5 | 0.5 | 0.5 |

The DDMC is made of a combination of digital filters. Digital filtering involves binary additions and subtractions, and the storage of samples which are used during several consecutive periods. Additions and subtractions can be parallel or serial operations. Parallel adders are the fastest and permit to use the same circuit to make several successive additions. Serial adders are much slower and thus cannot perform as many additions as parallel circuit, during a given period of time.

Samples can be stored in registers with parallel inputs and outputs or in shift registers (serial inputs and outputs). Naturally, shift-registers are preferred for serial operations, and parallel input registers for parallel operations.

Therefore, parallel and serial arithmetic circuits result in two different ways to implement the DDMC. Methods of implementing digital filters are taught, for example, in a book titled "Digital Signal Processing" by Radar and Robiner, pp. 118 to 125 and 144, 1972, IEEE Press, New York, U.S.A.

In the following, we will present a design example of the CVSD DDMC using serial structure. As the circuit is similar at any delta frequencies we will only present schematics of the CVSD DDMC for a 32 kHz delta.

FIG. 7 gives the complete schematics of the CVSD DDMC at 32 kHz sampling rate. Binary word lengths are indicated for each filter by numbers in parenthesis. The following conventions are used: $(a,b,c)$ $a$: indicates if a sign bit is needed (it is not needed for the envelope signal which is always positive).

$a = 1$ requests a sign bit $a = 0$ means that a sign bit is not necessary.

$b$: indicates the numbers of bits on the left side of the binary point.

$c$: indicates the number of bits on the right side of the binary point.

$c$ can be negative. This means that there is no bit on the right side of the binary point and that the truncation is made on the left side up to the bit of weight $2^{-c}$.

EXAMPLES (1,4.2) indicates a word which is either positive or negative, which maximum value is:

$$2^3 + 2^2 + 2^1 + 2^0 + 2^{-1} + 2^{-2} = 15.75$$

and which smallest value different from zero is:
$$2^{-2} = 0.25$$

Total number of bits: $1 + 4 + 2 = 7$
(0,5.3):
always positive; maximum value:

$$2^4 + 2^3 + 2^2 + 2^1 + 2^0 + 2^{-1} + 2^{-2} + 2^{-3} = 31.875$$

minimum value:
$$2^{-3} = 0.125;$$

Total number of bits: $0 + 5 + 3 = 8$

For a better understanding of FIg. 7, we will hereinafter explain in detail how a filter of the first-order type is implemented.

FIG. 8 shows a first order filter wherein the symbol 0.75 with the arrow under indicates a multiplication by a constant $k$ equal to 0.75 while T inside the blocks is to indicate a one period delay of the sampling period T. The signel $S(nT)$ is delayed by one period by the delay element to give $S(nT - T)$. Hence, in the example, the output at a sampling period $nT$ is:

$$S(nT) = e(nT) + 0.75 \, S(nT - T)$$

Therefore, in the light of the above equation, the operations to be performed are:
1. multiply $S(nT - T)$ by $k$;
2. add $k\ S(nT - T)$ to $e(nT)$; and
3. store the result $S(nT)$ into a memory in order to use it one period later as $S(nT - T)$.

These operations may be realized through the circuit shown in FIG. 9, wherein, for example, binary adders of the serial type are used and the values $e(nT)$ and $S(nT)$ are represented in binary form by a two's complement code.

Thus, the code 1,6.2 shown in FIG. 8, indicates that each binary word has $1 + 6 + 2 = 9$ bits, the first bit being the sign.

The input $e(nT)$ is from a shift register RD1 located in a preceding stage. At each sampling period, RD1 sends the 9 bits representative of $e(nT)$ one after the other into the adder AD1.

The output $S(nT)$ is fed to the shift register RD2 of the following stage and also into a shift register RD3 where it is stored in a memory to give $S(nT - T)$ for the following period.

To realize the multiplication $K \cdot S(nT - T)$, it is noted that $K = 0.75$, which is 0.11 in binary. We therefore obtain:

$$K\ S(nT - T) = 0.11S(nT - T) = 0.1S(nT - T) + 0.01S(nT - T)$$

And as a binary multiplication by 0.1 corresponds to one shifting to the right, while a multiplication by 0.01 responds to two shiftings to the right, it is only necessary to shift the content of RD3 by one position while transferring into RD4, and further into RD5 through shifting it by one more position to obtain:

$$0.1S(nT - T) \text{ and } 0.01S(nT - T)$$

Then the content of RD4 is added to the one of RD5 by $AD_2$ to give $KS(nT - T)$.

The foregoing is only an example of a serial implementation. It is possible by modifying slightly the principle of operation to decrease the number of shift registers required.

Now, referring generally to FIGS. 10 and 11, there is shown a further embodiment of the present invention which consists in providing a clock control circuit between the holder 21 and the sampler 22 (see FIG. 5) for synchronizing the sampling time of the DDMC delta clock and the intermediate clock (usually at 64 kHz). Indeed, such synchronization will prevent the reading by the sampler 22 of two linear PCM words at one sampling instant. This situation may happen, for instance, each time a word is entering into the holder while the preceding word is being shifted out. Then, the information contained in both words may be lost since the sampler is not able to see which one of these two words was first registered in the holder. Therefore, in order not to alter the binary word, the clock control circuit 30 has been devised.

Thus, the intermediate clock and the delta clock are simultaneously applied to the input D and C, respectively, of a flip-flop 31; this flip-flop will make the decision whether to delay or not the signal from the intermediate clock by generating a pulse $Tp$ at its Q output. Then, the pulse $Tp$ is added to the intermediate clock signal, which has been delayed by a delay circuit 32, by means of an OR gate to feed the sampler 22. In order to prevent any coincidence between the sampling time of the clocks, the delta clock signal is also delayed through delay circuit 33 of a time period preferably double of that provided by the delay circuit 32. Consequently, only one word registered in the holder may be read by the sampler at once.

The same above principle may be used when converting the intermediate rate into the PCM rate. However, by choosing a multiple of the PCM rate as an intermediate frequency, for instance an intermediate frequency of 64 kHz when the PCM rate is at 8 kHz, it is only necessary to take one sample out of eight.

We claim:
1. A digital converter for converting a delta modulation signal being at a delta rate into a pulse code modulation (PMC) signal flowing at a PCM rate, comprising
 a. a first conversion means receiving said delta signal for converting the code of said delta signal into an intermediate code, the signal of said intermediate code being at a rate corresponding to said delta rate;
 b. a second conversion means connected to said first conversion means for converting the rate of said intermediate code signal into the rate of said PCM signal;
 c. a third conversion means fed with said intermediate code signal at said PCM rate for converting said intermediate code into the code of said PCM signal, said third conversion means comprising a pulse code modulation compressor.

2. A digital converter as claimed in claim 1, wherein the intermediate code signal is a linear pulse code modulation signal.

3. A digital converter as claimed in claim 1, wherein said first conversion means includes a gain control circuit connected to a digital integration circuit for digitally integrating all binary numbers received from the digital control circuit and for producing once per delta sampling period a binary number which represents the sum of all delta steps, and a low-pass digital filter receiving said binary number for attenuating the high frequencies of said binary number, whereby said linear pulse code modulation signal at the delta rate is obtained.

4. A digital converter as claimed in claim 3, wherein said gain control circuit includes a digital control circuit receiving said delta signal, a digital low pass syllabic filter connected to the output of said digital control circuit, and a multiplier for weighting the input delta signal with the output of said syllabic filter.

5. A digital converter as claimed in claim 4, wherein the digital control circuit is controlled by a three-bit memory.

6. A digital converter as claimed in claim 3, wherein the digital integration circuit is a logic circuit which reconstructs the amplitude of the information contained in the delta signal.

7. A digital converter as claimed in claim 2, wherein said second conversion means include a holder for storing the linear pulse code modulation signal during a time equal to one delta sampling period, a first sampler connected to said holder for sampling the linear pulse code modulation signal at a predetermined sampling rate, a low-pass filter connected to said first sampler for filtering quantizing and out-of-band noises, and a second sampler for sampling the output of the low-pass filter at the pulse code modulation rate.

8. A digital converter as claimed in claim 7, wherein a clock control circuit is provided for synchronizing the signal holding time of said holder to the sampling rate of said first sampler, said control circuit including a flip-flop circuit simultaneously receiving a signal at said first sampler rate and another signal at said delta rate, an OR gate for adding said signal at the first sampler rate to an output of said flip-flop circuit, the output of said gate being applied to said first sampler while said another signal is applied to said holder.

9. A digital converter as claimed in claim 8, wherein said clock control circuit further includes a first delay circuit inserted before said gate and a second delay circuit inserted before said holder, said first delay circuit having a time delay which is half of the time delay of said second circuit.

10. A digital converter for converting a delta modulation signal being at a delta rate into a pulse code modulation (PCM) signal flowing at a PCM rate, comprising
   a. a code conversion means including a digital integration circuit receiving said delta signal for digitally integrating all binary numbers thereof and for producing once per delta sampling period a binary number which represents the sum of all delta steps, and a low-pass digital filter receiving said binary number for attenuating the high frequencies of said binary number, whereby the code of said delta signal is converted into an intermediate code, the signal of said intermediate code being a linear PCM signal flowing at said delta rate;
   b. a rate conversion means including a holder for storing said linear PCM signal during a time equal to one delta sampling period, a first sampler connected to said holder for sampling the linear PCM signal at a predetermined sampling rate, a low-pass filter connected to said first sampler for filtering quantizing and out-of-band noises, and a second sampler for sampling the output of the low-pass filter at said PCM rate, whereby the rate of said linear PCM signal is converted into the rate of said PCM signal;
   c. a pulse code modulation compresser receiving said linear PCM signal at the PCM rate for converting the code of said linear signal into the code of said PCM signal; whereby the code and the rate of said delta modulation signal is converted into the code and the rate of said PCM signal.

* * * * *